United States Patent
Sung et al.

(10) Patent No.: US 9,083,966 B2
(45) Date of Patent: Jul. 14, 2015

(54) DISPLAY DEVICE AND METHOD FOR MANUFACTURING PHASE RETARDER FILM THEREOF

(71) Applicant: AU OPTRONICS CORP., Hsin-Chu (TW)

(72) Inventors: Wen-Fang Sung, Hsin-Chu (TW); Wang-Shuo Kao, Hsin-Chu (TW); Chih-Wei Chen, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 46 days.

(21) Appl. No.: 13/941,647

(22) Filed: Jul. 15, 2013

(65) Prior Publication Data
US 2014/0218492 A1 Aug. 7, 2014

(30) Foreign Application Priority Data
Feb. 4, 2013 (TW) .............................. 102104220 A

(51) Int. Cl.
| | |
|---|---|
| G02F 1/1335 | (2006.01) |
| H04N 13/04 | (2006.01) |
| G02B 27/22 | (2006.01) |
| B05D 5/06 | (2006.01) |

(52) U.S. Cl.
CPC ............ *H04N 13/0434* (2013.01); *G02B 27/22* (2013.01); *H04N 13/0454* (2013.01); *B05D 5/06* (2013.01)

(58) Field of Classification Search
None
See application file for complete search history.

(56) References Cited

U.S. PATENT DOCUMENTS

| | | |
|---|---|---|
| 2010/0177175 A1 | 7/2010 | Chen et al. |
| 2011/0216277 A1 | 9/2011 | Chen et al. |
| 2011/0292329 A1 | 12/2011 | Huang et al. |
| 2011/0292330 A1 | 12/2011 | Huang et al. |
| 2012/0050261 A1 | 3/2012 | Feng et al. |
| 2012/0140129 A1 | 6/2012 | Chang et al. |

FOREIGN PATENT DOCUMENTS

| | | |
|---|---|---|
| CN | 102629000 A | 8/2012 |
| CN | 102759804 A | 10/2012 |
| TW | 200912429 A | 3/2009 |
| TW | 200933208 A | 8/2009 |

(Continued)

OTHER PUBLICATIONS

China Patent Office, "Office Action", Nov. 15, 2014.
(Continued)

*Primary Examiner* — Richard Kim
(74) *Attorney, Agent, or Firm* — WPAT, PC; Justin King

(57) ABSTRACT

A display device includes a display panel and a phase retarder film disposed on the display panel. The display panel has a first pixel region, a second pixel region and a third pixel region disposed between the first pixel region and the second pixel region. The phase retarder film has a first phase region, a second phase region and a third phase region disposed between the first phase region and the second phase region. The first phase region is disposed corresponding to the first pixel region, the second phase region is disposed corresponding to the second pixel region, and the third phase region is disposed corresponding to the third pixel region. A phase retardation of the third phase region is different from phase retardations of the first phase region and the second phase region. A method for manufacturing the phase retarder film is also provided.

8 Claims, 6 Drawing Sheets

(56) References Cited

FOREIGN PATENT DOCUMENTS

| | | |
|---|---|---|
| TW | 201027125 A | 7/2010 |
| TW | 201137400 A | 11/2011 |
| TW | 201142438 A | 12/2011 |

OTHER PUBLICATIONS

Taiwan Patent Office, "Office Action", Sep. 1, 2014.

Fung-Hsu Wu et al, "Structure of Pattern Retarder Film and Method of Making the Same" U.S. Appl. No. 61/348,768, filed May 27, 2010.

Kuan-Hao Huang et al. "Structure of Pattern Retarder Film and Method of Making the Same" U.S. Appl. No. 61/367,033, filed Jul. 23, 2010.

DISPLAY DEVICE AND METHOD FOR MANUFACTURING PHASE RETARDER FILM THEREOF

FIELD OF THE INVENTION

The present invention relates to a display device and a method for manufacturing a phase retarder film, and more particularly to a display device having improved image quality and a method for manufacturing a phase retarder film thereof.

BACKGROUND OF THE INVENTION

With improvements and developments in science and technology, people's desire of enjoyment in material life and spiritual level has always been increased and never reduced. In the era of rapid changes in technology, people hope to realize unrestrained imagination by display device to achieve immersive experience. Therefore, how to make the display device display stereo images has become an anxious target to achieve in display technology. In one kind of the stereo display devices, a phase retarder film having two different phase regions is attached outside a display panel, to make lights provided by pixel regions for displaying left-eye images and lights provided by pixel regions for displaying right-eye images have different polarization states. By means of this, lights for the left-eye and lights for the right-eye respectively pass through polarization lenses with different polarization states of a polarization glasses, and then the left eye and the right eye of a user can receive different images, thereby establishing stereo images in user's mind.

In order to prevent the lights provided by the pixel region from diagonally passing through an improper phase retardation region and therefore delivering an improper image to the user. A black matrix is disposed between the pixel regions for the left-eye image and the pixel regions for the right-eye image, and further, an area of the black matrix is increased for enhancing a vertical viewing angle of the stereo image. However, for the high resolution display device, the increase of the area of the black matrix decreases light transmittance of the display device. A solution of this problem is to periodically input a right-eye image signal, a dark state signal, a left-eye image signal and a dark state signal in sequence to the display panel and make the area of the phase region of the phase retarder film be substantially equal to twice of the area of the pixel region. As a result, the display device could have the better light transmittance when displaying two-dimensional images and the better three-dimensional viewing angle when displaying stereo images.

However, in the forgoing display device that the area of the phase region is substantially as twice as the area of the pixel region, light and dark stripes (i.e. stripe mura) are generated in the images when the display device displays the two-dimensional images, and the stripe mura is more obvious when viewed at a greater viewing angle. The phase retarder film is a multilayer film coated by materials with different phase retardations, such that different portions of a surface of the phase retarder film have different refractive indexes, thereby generating the stripe mura in the image. Therefore, how to solve or improve the abovementioned problems has become one of the key concerns in display technology.

SUMMARY OF THE INVENTION

A display device provided by an embodiment of the present invention includes a display panel and a phase retarder film. The display panel has at least a first pixel region, at least a second pixel region and at least a third pixel region. The third pixel region is disposed between the first pixel region and the second pixel region. The phase retarder film is disposed on the display panel. The phase retarder film has at least a first phase region, at least a second phase region and at least a third phase region. The third phase region is disposed between the first phase region and the second phase region. The first phase region is disposed corresponding to the first pixel region, while the second phase region is disposed corresponding to the second pixel region and the third phase region is disposed corresponding to the third pixel region. A phase retardation of the third phase region is different from phase retardations of the first phase region and the second phase region.

A method for manufacturing phase retarder film provided by an embodiment of the present invention includes steps of: providing a substrate; and forming an alignment layer on the substrate. The alignment layer has at least a first phase region, at least a second phase region and at least a third phase region, the third phase region is disposed between the first phase region and the second phase region, and a phase retardation of the third phase region is different from phase retardations of the first phase region and the second phase region.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
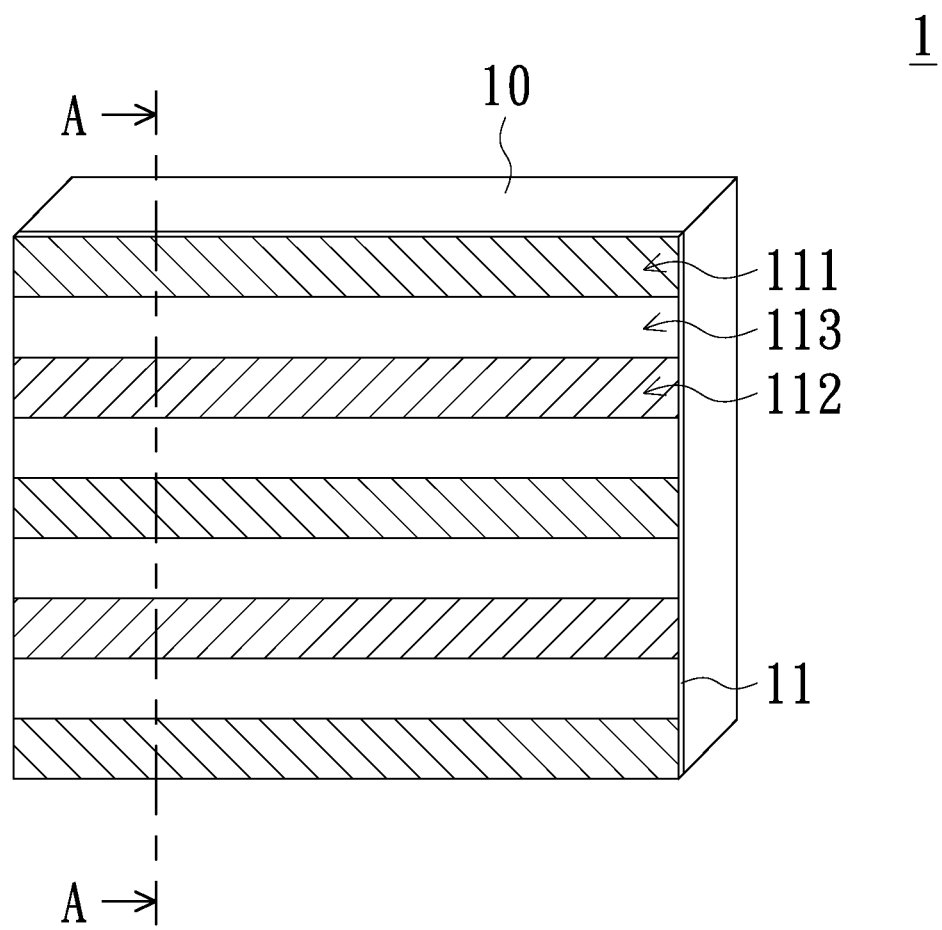
FIG. 1A is a schematic, three-dimensional view of a display device according to an embodiment of the present invention.
Figure 1B:
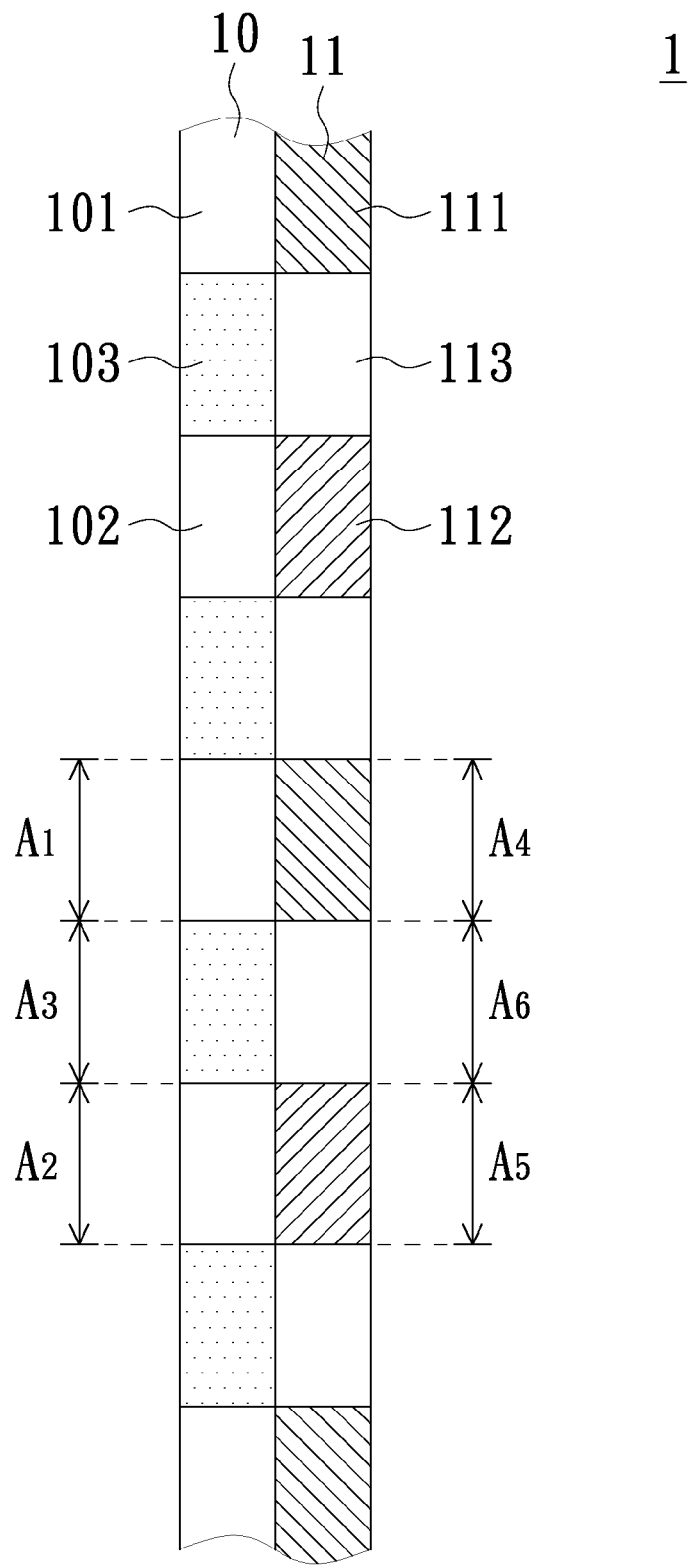
FIG. 1B is a schematic, cross-sectional view of FIG. 1A, taken along line A-A thereof.

FIG. 1A is a schematic, three-dimensional view of a display device according to an embodiment of the present invention. FIG. 1B is a schematic, cross-sectional view of FIG. 1A, taken along line A-A thereof. Referring to FIGS. 1A and 1B, the display device 1 of the embodiment includes a display panel 10 and a phase retarder film 11. The display panel 10 includes at least a first pixel region 101, at least a second pixel region 102 and at least a third pixel region 103. The third pixel region 103 is disposed between the first pixel region 101 and the second pixel region 102. The phase retarder film 11 is disposed on the display panel 10. The phase retarder film 11 includes at least a first phase region 111, at least a second phase region 112 and at least a third phase region 113. The third phase region 113 is disposed between the first phase region 111 and the second phase region 112. The first phase region 111 is disposed corresponding to the first pixel region 101, the second phase region 112 is disposed corresponding to the second pixel region 102, and the third phase region 113 is disposed corresponding to the third pixel region 103. A phase retardation of the third phase region 113 is different from phase retardations of the first phase region 111 and the second phase region 112.

In the embodiment, the display device 1, for example, includes a plurality of the first pixel regions 101, a plurality of the second pixel regions 102 and a plurality of the third pixel regions 103. The first pixel regions 101, the second pixel regions 102 and the third pixel regions 103 are arranged in an array. More concretely, the first pixel regions 101, the second pixel regions 102 and the third pixel regions 103 are alternately arranged with each other. The phase retarder film 11, for example, includes a plurality of the first phase regions 111, a plurality of the second phase regions 112 and a plurality of the third phase regions 113. The first phase regions 111, the second phase regions 112 and the third phase regions 113 are arranged in an array. More concretely, the first phase regions 111, the second phase regions 112 and the third phase regions 113 are alternately arranged with each other.

The first phase regions 111 have the same phase retardation, the second phase regions 112 have the same phase retardation, and the third phase regions 113 have the same phase retardation. The phase retardation of the first phase regions 111 is different from the phase retardation of the second phase regions 112. More concretely, in the embodiment, the phase retardation of the first phase regions 111, for example, is ¼ of wavelength, the phase retardation of the second phase regions 112, for example, is −¼ of wavelength, and the phase retardation of the third phase regions 113, for example, is zero. Therefore, an image displayed by the display panel 10 is polarized to different polarization states such as the left-hand circularly polarized light and the right-hand circularly polarized light when it passes through the phase retarder film 11. Accordingly, by means of wearing polarization glasses, user's left eye and right eye could respectively receive images with different polarization states, thereby establishing a stereo image in user's mind. In another embodiment, the phase retardation of the first phase regions 111 may be −¼ of wavelength, the phase retardation of the second phase regions 112 may be ¼ of wavelength, and the phase retardation of the third phase regions 113 may be zero.

Hereinafter, position relations between the first pixel regions 101, the second pixel regions 102 and the third pixel regions 103 of the display panel 10 and the first phase regions 111, the second phase regions 112 and the third phase regions 113 of the phase retarder film 11 are described in detail. Referring to FIG. 1B, in the embodiment, areas A1, A2, A3 of the first pixel region 101, the second pixel region 102 and the third pixel region 103 of the display panel 10, for example, are respectively equal to areas A4, A5, A6 of the first phase region 111, the second phase region 112 and the third phase region 113 of the phase retarder film 11. The areas A4, A5, A6 of the first phase region 111, the second phase region 112 and the third phase region 113 of the phase retarder film 11 are substantially equal to each other. In other words, the first pixel regions 101, the second pixel regions 102 and the third pixel regions 103 completely cover the first phase regions 111, the second phase regions 112 and the third phase regions 113. More concretely, when the display device 1 is in a stereo display state, the image output from the first pixel regions 101 of the display panel 10 is converted to a first polarized image after passing through the first phase regions 111, the image output from the second pixel regions 102 of the display panel 10 is converted to a second polarized image after passing through the second phase regions 112, and the third pixel regions 103 corresponding to the third phase regions 113 display a dark state image. The third pixel regions 103 displaying the dark state image prevents the lights from diagonally passing through improper phase regions, so as to prevent the user from receiving improper images.

In the embodiment, the phase retarder film 11 includes the third phase regions 113 corresponding to the third pixel regions 103 displaying the dark state image, and the phase retardation of the third phase regions 113 is zero. When the display device 1 is in a two-dimensional display state (the display panel 10 utilizes the first pixel regions 101, the second pixel regions 102 and the third regions to display the two-dimensional image), light transmittance difference caused by interferences generated between films with different phase retardations is avoided. In other words, when the display device 1 is in the two-dimensional display state, a greater region of the phase retarder film 11 which is not affected by film interference effect is provided, and therefore, the display device 1 has better image quality in the two-dimensional display state.

Figure 2:
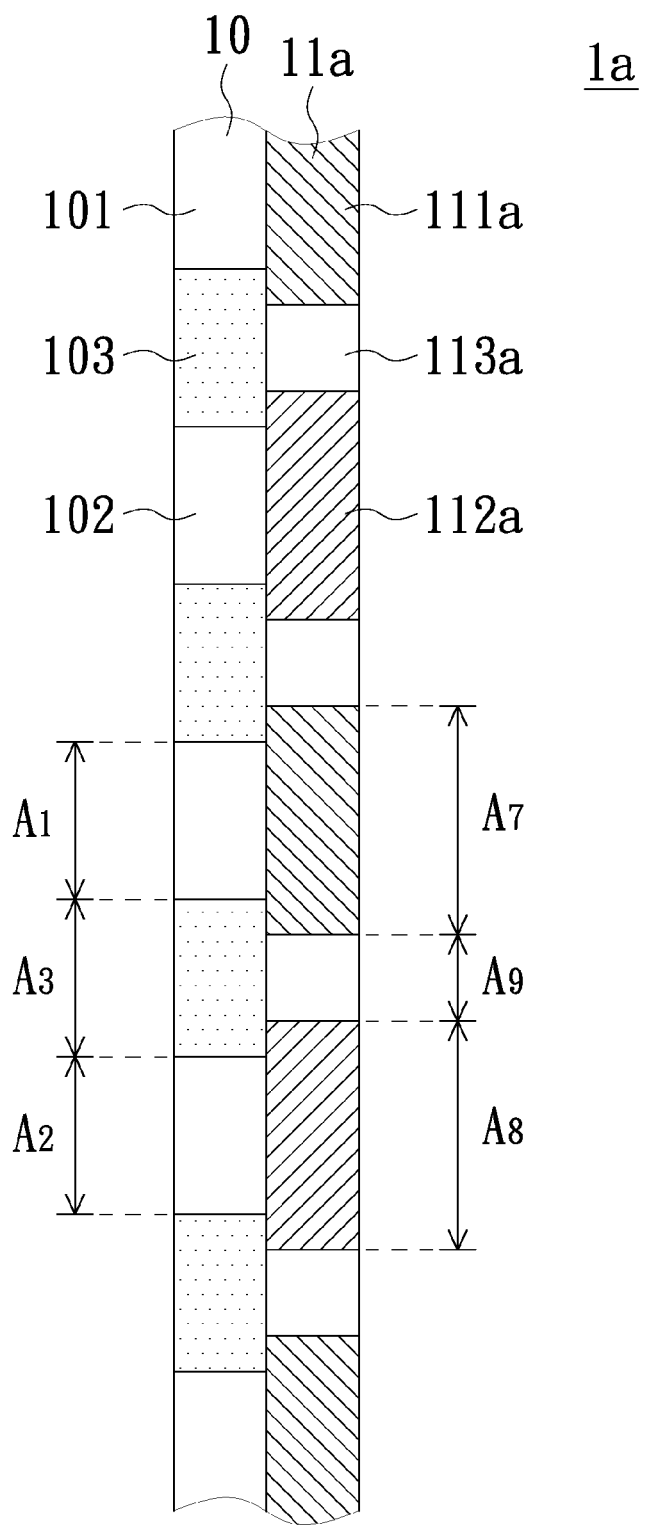
FIG. 2 is a schematic, cross-sectional view of a display device according to another embodiment of the present invention.

FIG. 2 is a schematic, cross-sectional view of a display device 1 according to another embodiment of the present invention. Referring to FIG. 2, the display device 1a of the embodiment is substantially similar to the display device 1 shown in FIGS. 1A and 1B. The difference is an area A9 of the third phase region 113a of the phase retarder film 11a is smaller than the area A3 of the third pixel region 103 of the display panel 10. When the area A9 of the third phase region 113a is smaller than the area A3 of the third pixel region 103, areas A7, A8 of the first phase region 111a and the second phase region 112a of the phase retarder film 11a are respectively greater than the areas A1, A2 of the first pixel region 101 and the second pixel region 102 of the display panel 10, and the areas A7, A8 of the first phase region 111a and the second phase region 112a are respectively greater than the area A9 of the third phase region 113a. In the second embodiment, the proportion of the areas A7, A8 and A9 of the first phase region 111a, the second phase region 112a and the third phase region 113a, for example, is, but not limited to, 4:4:1. Otherwise, in the embodiment, the area A7 of the first phase region 111a, for example, equals to the area A8 of the second phase region 112a. In another embodiment, the area A7 of the first phase region 111a may be different from the area A8 of the second phase region 112a.

Hereinafter, position relations between the first pixel regions 101, the second pixel regions 102 and the third pixel regions 103 of the display panel 10 and the first phase regions 111a, the second phase regions 112a and the third phase regions 113a of the phase retarder film 11a are described in detail. Referring to FIG. 2, when the area A9 of the third phase region 113a is smaller than the area A3 of the third pixel region 103, the third phase regions 113a, for example, but not limited to, correspond to central areas of the third pixel regions 103. Because the areas A7, A8 of the first phase region 111a and the second phase region 112a are respectively greater than the areas A1, A2 of the first pixel region 101 and the second pixel region 102, each of the first phase regions 111a corresponds to one of the first pixel regions 101 and a portion of one of the third pixel regions 103, and each of the second phase regions 112a corresponds to one of the second pixel regions 102 and a portion of one of the third pixel regions 103.

In the embodiment, because the area A9 of the third phase region 113a is smaller than the area A3 of the third pixel region 103, when the display device 1a is in the stereo display state, the vertical viewing angle of the stereo image is enhanced, while when the display device 1a is in the two-dimensional display state, the phase retarder film 11a provides a greater region which is not affected by the film interference effect. Therefore, the image quality is improved when the display device 1a is in the two-dimensional display state.

Figure 3A:
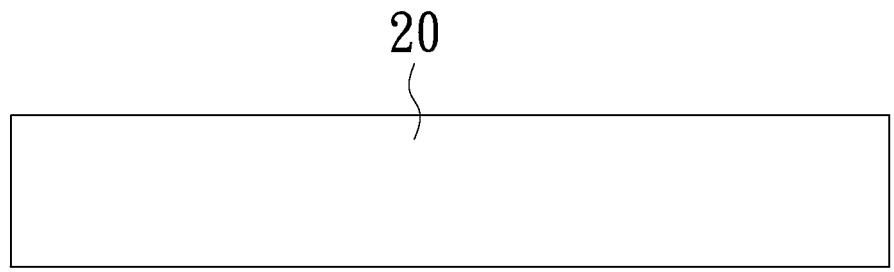
FIGS. 3A to 3F are flow chart views showing a method for manufacturing a phase retarder film according to an embodiment of the present invention.
Figure 3B:
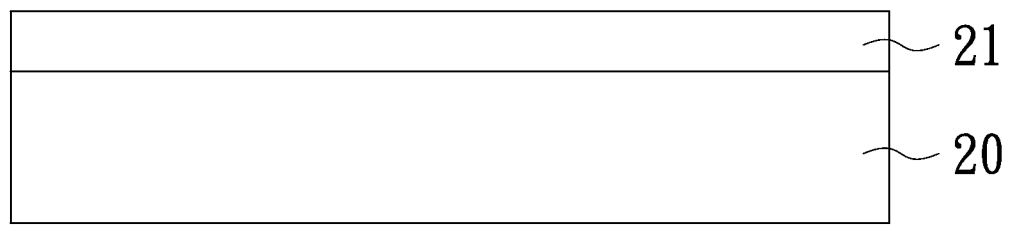

FIGS. 3A to 3F are flow chart views showing a method for manufacturing a phase retarder film according to an embodiment of the present invention. As shown in FIG. 3A, a substrate 20 is provided. A material of the substrate 20 may include, but not limited to, triacetyl cellulose (TAC), polyethylene terephthalate (PET), polycarbonate (PC), polymethyl methacrylate (PMMA), or cyclo-olefin polymer (COP). Afterwards, as shown in FIG. 3B, an alignment layer 21 is formed on the substrate 20.

Figure 3C:
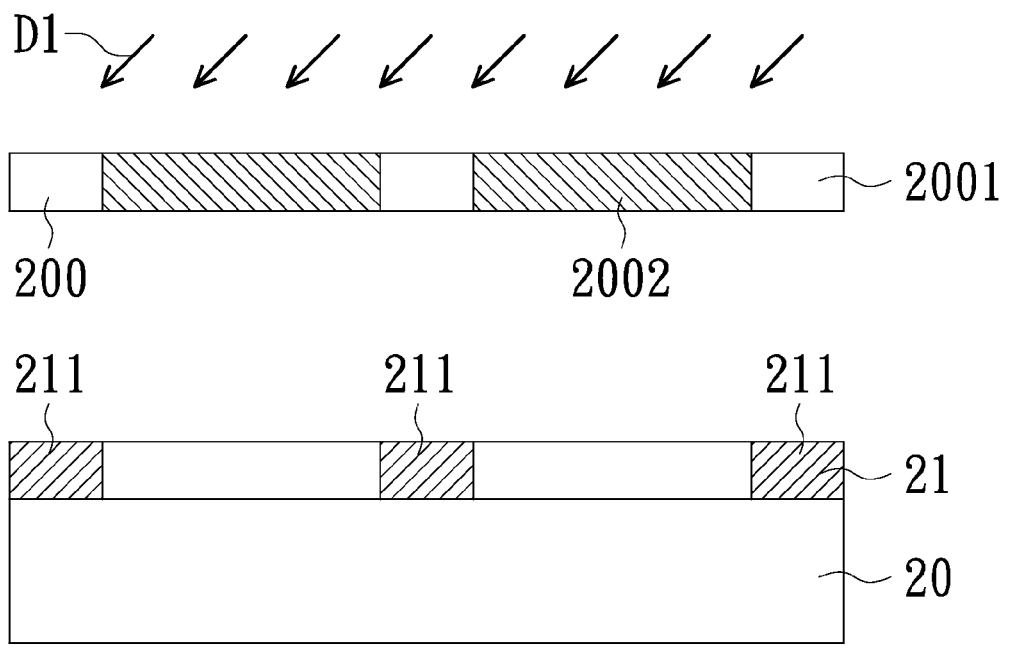
Figure 3D:
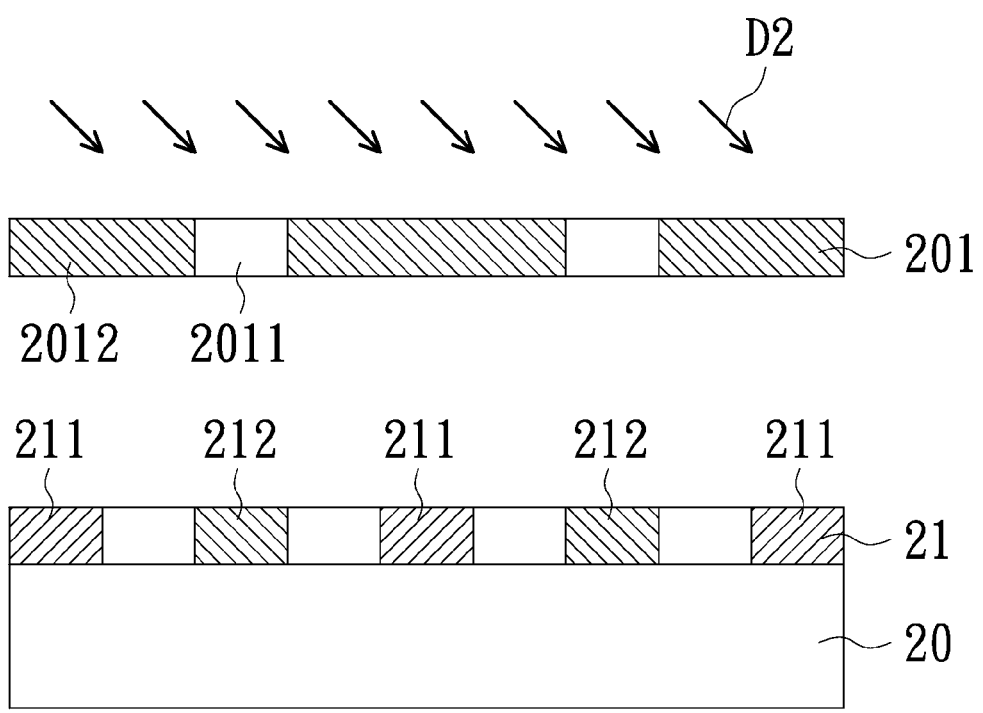
Figure 3E:
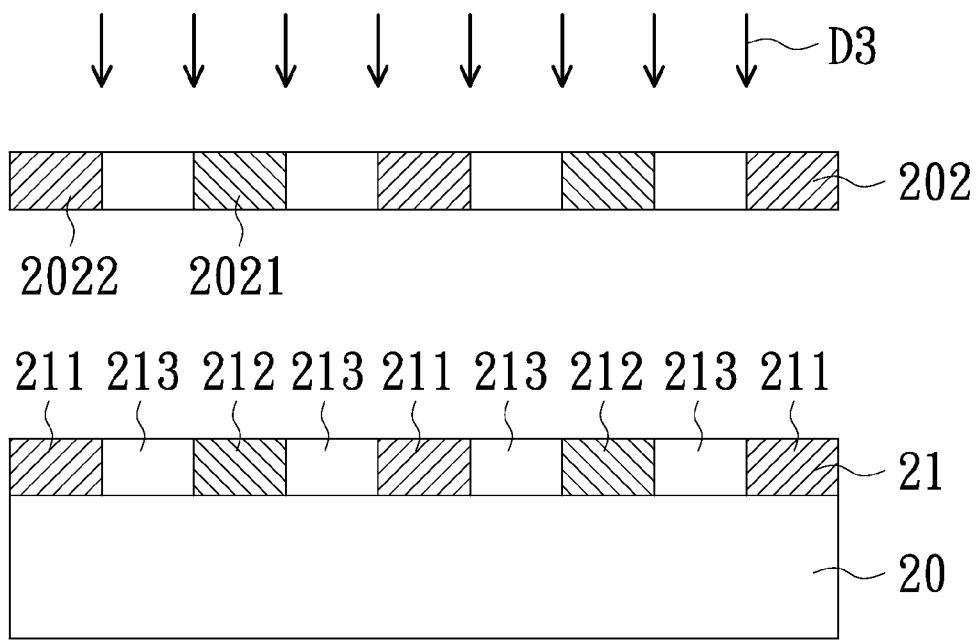

Then, as shown in FIGS. 3C to 3E, a first patterning process, a second patterning process, and a third patterning process are sequentially executed on the alignment layer 21. Each of the first patterning process, the second patterning process and the third patterning process, for example, is a lithography process. Referring to FIG. 3A, the first patterning process is firstly executed on the alignment layer 21. In the process, a photomask 200 having light-pervious zones 2001 and light-shading zones 2002 is disposed above the alignment layer 21 to execute a first photo-exposure process. The first photo-exposure process, for example, is executed by using linearly polarized ultraviolet lights. In the first photo-exposure process, the linearly polarized ultraviolet lights pass through the light-pervious zones 2001 of the photomask 200 along a direction D1 and irradiate on the alignment layer 21 with an incident angle of 45 degrees, and further first phase regions 211 are formed on the alignment layer 21. The phase retardation of the first phase regions 211, for example, is ¼ of wavelength.

Referring to FIG. 3D, the second patterning process is executed on the alignment layer 21. In the process, a photomask 201 having light-pervious zones 2011 and light-shading zones 2012 is disposed above the alignment layer 21 to execute a second photo-exposure process, wherein the light-pervious zones 2011 of the photomask 201 correspond to portions of the alignment layer 21 which are not exposed in the first photo-exposure process. In the second photo-exposure process, the linearly polarized ultraviolet lights pass through the light-pervious zones 2011 of the photomask 201 along a direction D2 and irradiate on the alignment layer 21 with an incident angle of −45 degrees, and further second phase regions 212 are formed on the alignment layer 21. The phase retardation of the second phase regions 212, for example, is −¼ of wavelength.

Referring to FIG. 3E, the third patterning process is executed on the alignment layer 21. In the process, a photomask 202 having light-pervious zones 2021 and light-shading zones 2022 is disposed above the alignment layer 21 to execute a third photo-exposure process, wherein the light-pervious zones 2021 correspond to portions of the alignment layer 21 which are not exposed in the first photo-exposure process and the second photo-exposure process. In the third photo-exposure process, the linearly polarized ultraviolet lights pass through the light-pervious zones 2021 of the photomask 202 along a direction D3 and irradiate on the alignment layer 21 with an incident angle of zero degree, and further third phase regions 213 are formed on the alignment layer 21. The phase retardation of the third phase regions 213, for example, is zero.

Figure 3F:
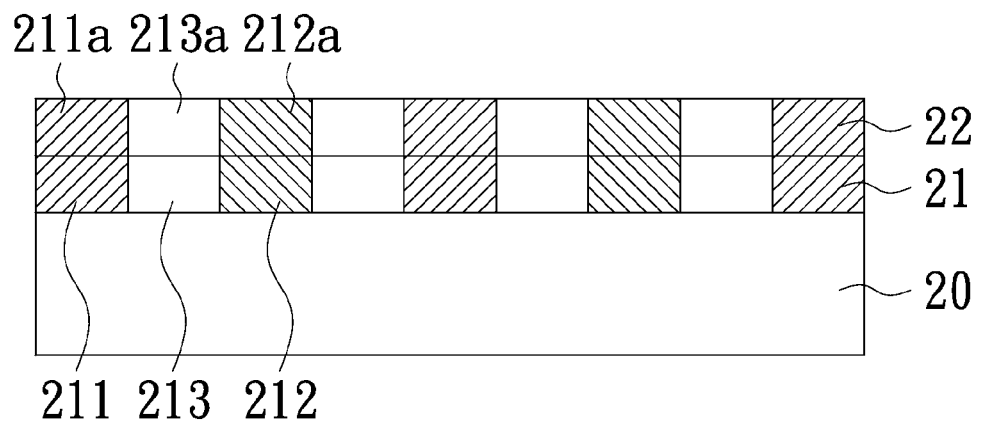

Referring to FIG. 3F, a liquid crystal layer 22 is formed on the alignment layer 21 with the first phase regions 211, the second phase regions 212 and the third phase regions 213, and then, the liquid crystal layer 22 is aligned by the alignment layer 21 to form phase regions 211a, 212a, 213a. The phase region 211a and the first phase region 211 have the same phase retardation, the phase region 212a and the second phase region 212 have the same phase retardation, and the phase region 213a and the third phase region 211 have the same phase retardation. Then, a curing process is executed to cure the liquid crystal layer 22. The curing process may be, but not limited to, an ultraviolet curing process or a thermo curing process.

It should be mentioned that, in the first patterning process, the second patterning process and the third patterning process shown in FIGS. 3C to 3E, the first phase regions 211, the second phase regions 212 and the third phase regions 213 with different phase retardations are formed on the alignment layer 21 by lithography processes. However, in another embodiment, the first phase regions 211, the second phase regions 212 and the third phase regions 213 can be respectively formed by physical alignment manner such as a rubbing process.

In summary, in the embodiments of the present invention, the phase retarder film has at least a first phase region, at least a second phase region and at least a third phase region, the third phase region is disposed between the first phase region and the second phase region, and the phase retardation of the third phase region is different from the phase retardations of the first phase region and the second phase region. When the phase retarder film is disposed on the display panel, the first phase region, the second phase region and the third phase region respectively correspond to the first pixel region, the second pixel region and the third pixel region of the display panel. Because of this structure, the stripe mura appeared in the images output from the display device is obviously reduced when the display device is in the two-dimensional display state. In addition, the present invention further provides the method for manufacturing the phase retarder film. By means of cooperating the improved phase retarder film with the display panel, the stripe mura appeared in the images output from the display device is obviously reduced and even become invisible when the display device is in the two-dimensional display state.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display device comprising:
  a display panel having at least a first pixel region, at least a second pixel region and at least a third pixel region, wherein the third pixel region is disposed between the first pixel region and the second pixel region; and
  a phase retarder film disposed on the display panel, the phase retarder film having at least a first phase region, at least a second phase region and at least a third phase region, the third phase region being disposed between the first phase region and the second phase region, the first phase region being disposed corresponding to the first pixel region, the second phase region being disposed corresponding to the second pixel region, the third phase region being disposed corresponding to the third pixel region, and a phase retardation of the third phase region being different from phase retardations of the first phase region and the second phase region;

wherein the phase retardation of the first phase region is different from the phase retardation of the second phase region.

2. The display device according to claim 1, wherein the phase retardation of the first phase region is ¼ of wavelength, the phase retardation of the second phase region is −¼ of wavelength, and the phase retardation of the third phase region is zero.

3. The display device according to claim 1, wherein the phase retardation of the first phase region is −¼ of wavelength, the phase retardation of the second phase region is ¼ of wavelength and the phase retardation of the third phase region is zero.

4. The display device according to claim 1, wherein an area of the third phase region is smaller than or equal to an area of the third pixel region.

5. The display device according to claim 4, wherein when the area of the third phase region equals to the area of the third pixel region, areas of the first phase region and the second phase region are respectively equal to areas of the first pixel region and the second pixel region, and the areas of the first phase region, the second phase region and the third phase region are equal to each other.

6. The display device according to claim 4, wherein when the area of the third phase region is smaller than the area of the third pixel region, areas of the first phase region and the second phase region are respectively greater than areas of the first pixel region and the second pixel region, and the areas of the first phase region and the second phase region are respectively greater than the area of the third phase region.

7. The display device according to claim 4, wherein when the area of the third phase region is smaller than the area of the third pixel region, the third phase region corresponds to a central area of the third pixel region, the first phase region corresponds to the first pixel region and a portion of the third pixel region, and the second phase region corresponds to the second pixel region and a portion of the third pixel region.

8. The display device according to claim 1, wherein when the display device is in a two-dimensional display state, the display panel utilizes the first pixel region, the second pixel region and the third region to display a two-dimensional image, when the display device is in a stereo display state, the third pixel region of the display panel is in a dark state, a first image output from the first pixel region is converted to a first polarized image after passing through the first phase region, and a second image output from the second pixel region is converted to a second polarized image after passing through the second phase region.

* * * * *